United States Patent
King et al.

(10) Patent No.: US 7,196,306 B2
(45) Date of Patent: Mar. 27, 2007

(54) IMAGE SENSOR PIXEL CIRCUITRY WITH TRANSISTORS TO IMPROVE DYNAMIC RANGE

(75) Inventors: Ya-Chin King, Taipei (TW); Cheng-Hsiao Lai, Taipei (TW); Che-I Lin, Taipei (TW)

(73) Assignee: Via Technologies Inc., Taipei (TW)

( * ) Notice: Subject to any disclaimer, the term of this patent is extended or adjusted under 35 U.S.C. 154(b) by 48 days.

(21) Appl. No.: 11/144,933

(22) Filed: Jun. 3, 2005

(65) Prior Publication Data

US 2005/0269488 A1 Dec. 8, 2005

Related U.S. Application Data

(60) Provisional application No. 60/577,094, filed on Jun. 4, 2004.

(51) Int. Cl.
*H01L 27/00* (2006.01)
(52) U.S. Cl. .............. 250/208.1; 250/214 R; 348/307; 348/308
(58) Field of Classification Search ............ 250/208.1, 250/214 R; 348/307, 308; 327/514
See application file for complete search history.

(56) References Cited

U.S. PATENT DOCUMENTS

| | | | | |
|---|---|---|---|---|
| 6,046,444 A * | 4/2000 | Afghahi | ................ | 250/208.1 |
| 6,054,704 A * | 4/2000 | Pritchard et al. | ........ | 250/208.1 |
| 6,097,022 A * | 8/2000 | Merrill et al. | ........... | 250/208.1 |
| 6,211,510 B1 * | 4/2001 | Merrill et al. | ........... | 250/208.1 |
| 6,317,154 B2 * | 11/2001 | Beiley | ........................ | 348/308 |
| 6,410,899 B1 * | 6/2002 | Merrill et al. | ........... | 250/208.1 |
| 6,556,244 B1 * | 4/2003 | So et al. | ..................... | 348/296 |
| 6,646,245 B2 * | 11/2003 | Nair | ........................ | 250/208.1 |
| 6,667,768 B1 * | 12/2003 | Fossum | ..................... | 348/308 |
| 6,741,283 B1 * | 5/2004 | Merrill et al. | .............. | 348/308 |
| 6,930,338 B2 * | 8/2005 | Lee | ............................. | 257/292 |
| 2003/0103153 A1 * | 6/2003 | Fossum | ..................... | 348/308 |

* cited by examiner

*Primary Examiner*—Stephone B. Allen
*Assistant Examiner*—Davienne Monbleau
(74) *Attorney, Agent, or Firm*—Thomas, Kayden, Horstemeyer & Risley

(57) ABSTRACT

An image sensor comprising a pixel sensor, a first transistor, a second transistor, a third transistor and a fourth transistor. The pixel sensor receives illumination to generate a photocurrent. The first transistor coupled to a voltage source and the pixel sensor, is controlled by a reset signal to activate or deactivate. A first node is coupled to the first transistor and the pixel sensor, and the voltage source provide a first potential. The second transistor coupled to a second node and the first node, receives a reference voltage. The third transistor, coupled to the voltage source, is controlled by the voltage on the second node. The fourth transistor coupled to the third transistor and the image sensor, is controlled by a selection signal to activate or deactivate.

7 Claims, 6 Drawing Sheets

IMAGE SENSOR PIXEL CIRCUITRY WITH TRANSISTORS TO IMPROVE DYNAMIC RANGE

BACKGROUND

The invention is supported by the provisional application U.S. 60/577,094 filed on Jun. 4, 2004.

The invention relates to an image sensor, and in particular, to a CMOS image sensor.

Image sensors convert light to digital signals. A typical image sensor comprises a pixel sensor array. An image is brought into focus on the image sensor via lenses, and the pixel sensors convert the image into digital signals for data processing.

CMOS image sensors, in comparison to conventional image sensors, are cost effective and compact. Specifically, CMOS image sensors comprise several advantages including low operating voltage, low power consumption, random accessibility of image data, CMOS logic design compatibility, and simplified camera design with a single chip. The pixel sensors are referred to as active pixel sensor (APS). An APS includes a plurality of transistors, a photodiode and a current generator. For example, a typical three-transistor APS comprises a reset transistor, a source follower transistor, a row selection transistor, a photodiode and a current generator.

The ratio of maximum and minimum intensity detectable by the image sensor is referred to as a dynamic range (measured in DB). A higher dynamic range may provide better illumination resolution. The human eye is capable of sensing a wide range of illumination, and when intensity is high, the eye automatically decreases it sensitivity. Conventional image sensors, however, may be saturated when the intensity is high, causing image distortion. This phenomenon is referred to as machine mode. The saturation limits the dynamic range of the image sensor, making it difficult to simulate human eye sensibility.

SUMMARY

An image sensor is provided. An exemplary embodiment of the image sensor comprises: a pixel sensor; a first transistor; a second transistor; a third transistor and a fourth transistor. The pixel sensor receives illumination to generate a photocurrent. The first transistor, coupled to a voltage source and the pixel sensor, activated or deactivated by a reset signal. The first transistor and the pixel sensor are cascaded on a first node, and the voltage source provides a first potential. The second transistor, coupled to a second node and the first node, receives a reference voltage. The third transistor, coupled to the voltage source, is controlled by the voltage on the second node. The fourth transistor, coupled to the third transistor and the image sensor, is controlled by a selection signal to activate or deactivate.

The first to fourth transistors may be NMOS transistors. Alternatively, the first and second transistors may be PMOS transistors, and the third and fourth transistors may be NMOS transistors. The gate of the second transistor receives the reference voltage. The source and drain of the second transistor couple to the first and second node respectively.

Another embodiment of the invention provides an image sensing method for an image sensor. In a reset stage, the following steps are processed. First, the first transistor is activated through the reset signal, such that the first node is pulled to the first potential. Thereafter, the reference voltage is sustained at a second potential, wherein the second potential is lower than the first potential. In a response stage, the following steps are processed. First, the first transistor is deactivated through the reset signal, such that the potential of the first node varies with the illumination intensity. Thereafter, the reference signal is incrementally increased. The potential variation on the second node is then recorded to generate an output proportional to the illumination intensity.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION

Figure 1:
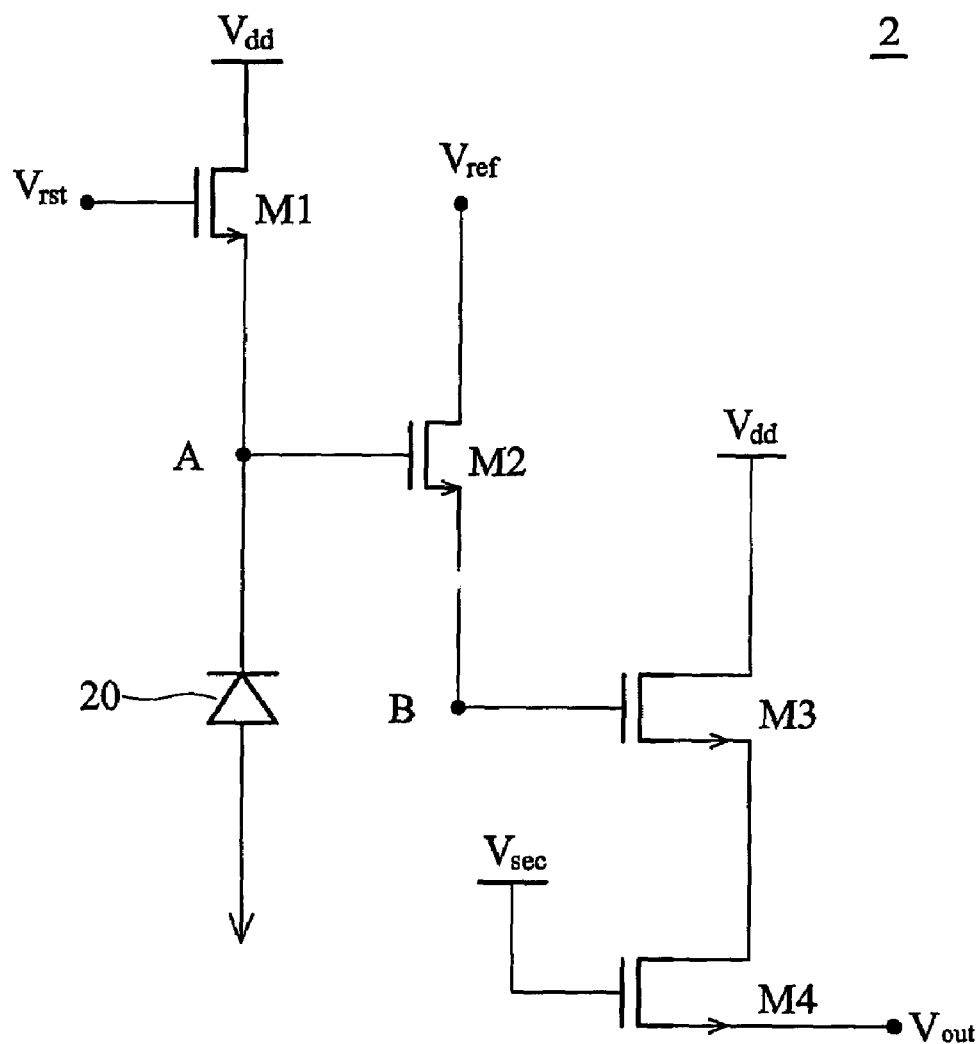
FIG. 1 shows an embodiment of an image sensor according to the invention.

FIG. 1 shows an embodiment of an image sensor. The image sensor 2 comprises a pixel sensor 20, a first transistor M1, a second transistor M2, and a third transistor M3 and a fourth transistor M4. The first transistor M1 is an NMOS transistor coupled to the voltage source $V_{dd}$ and the pixel sensor 20. The gate of the first transistor M1 is coupled to a reset signal $V_{rst}$. A node A is disposed between the first transistor M1 and the pixel 20. The pixel sensor 20 is a photodiode or a photo transistor capable of converting light into photocurrent. When the pixel sensor 20 receives light, photocurrent is generated, conducting charges from node A to ground. The photocurrent magnitude is proportional to light intensity. For example, the pixel sensor 20 generates a photocurrent increasing linearly with the growth of light intensity. As a result, the potential of node A is pulled down, varying the source voltage of the second transistor M2, thus the final output $V_{out}$ is determined.

In this embodiment, the second transistor M2 is an NMOS transistor with a drain coupled to a reference voltage $V_{ref}$, a gate coupled to the node A, and a source coupled to a node B. The third transistor M3 is an NMOS transistor with a drain coupled to a voltage source $V_{dd}$, a gate coupled to the node B, a source coupled to a fourth transistor M4. The fourth transistor M4 is an NMOS transistor with a drain/source coupled to the third transistor M3 and the output node $V_{out}$, and a gate coupled to a row selection signal $V_{sec}$. The fourth transistor M4 is activated or deactivated by the row selection signal $V_{sec}$.

Figure 2:
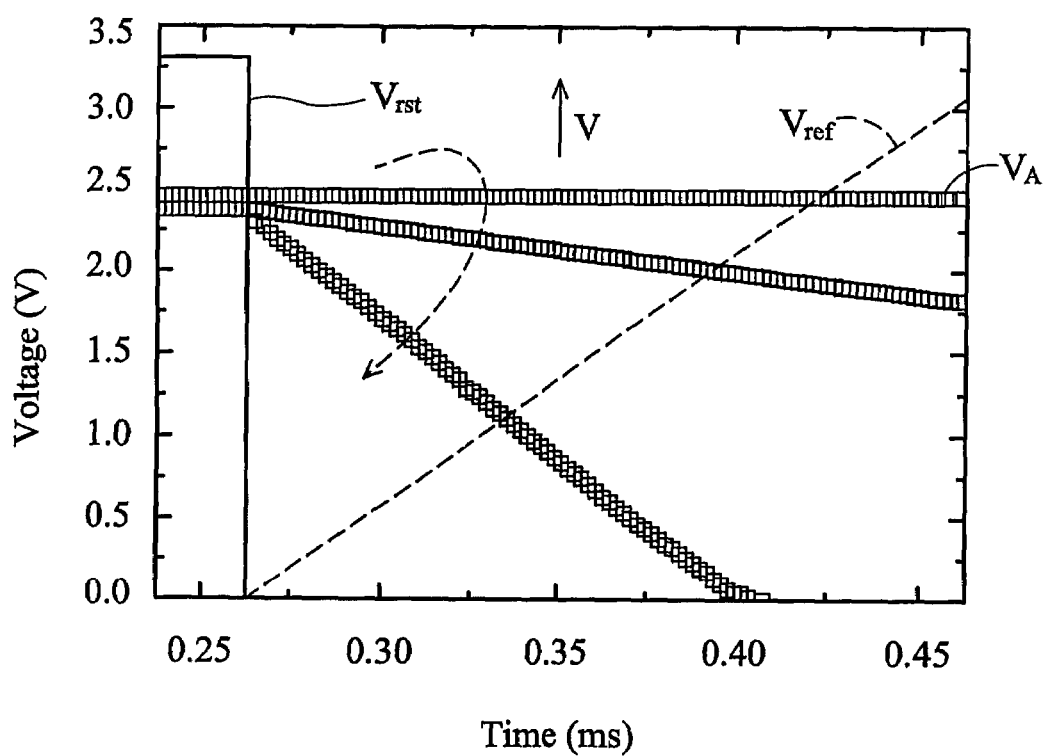
FIG. 2 is a timing chart of FIG. 1.

FIG. 2 is a timing chart of FIG. 1, presenting the relationship between the reset signal $V_{rst}$, the reference voltage $V_{ref}$, the potential on node A, $V_A$. The reference voltage $V_{ref}$ is a ramp voltage increasing linearly over time. The decreasing rate of voltage $V_A$ is dependent on the photocurrent magnitude. The greater the photocurrent is, the faster the voltage $V_A$ decreases.

As shown in FIG. 2, the process is initially in a reset stage, wherein the reset signal $V_{rst}$ is at high potential, the voltage $V_A$ is $V_{dd}-V_{th}$, and the $V_{ref}$ is 0 volt. Thereafter, the process goes to a response stage, the reset voltage $V_{rst}$ is switched to low potential, and the reference voltage $V_{ref}$ begins to increase linearly over time. When the difference between $V_A$ and $V_{ref}$ is no greater than $V_{th}$ ($V_A-V_{ref}<=V_{th}$), the second transistor M2 is deactivated. The potential on node B is inversely proportional to the light intensity, and the third transistor M3 driven by the potential on node B, determines the current flowing from $V_{dd}$ to the output node $V_{out}$. The potential on the output node $V_{out}$ is gradually increased by the current flooding from the third transistor M3, and eventually high enough to deactivate the third transistor M3. When the third transistor M3 is deactivated, the output voltage $V_{out}$ is proportional to the potential on node B.

Figure 3:
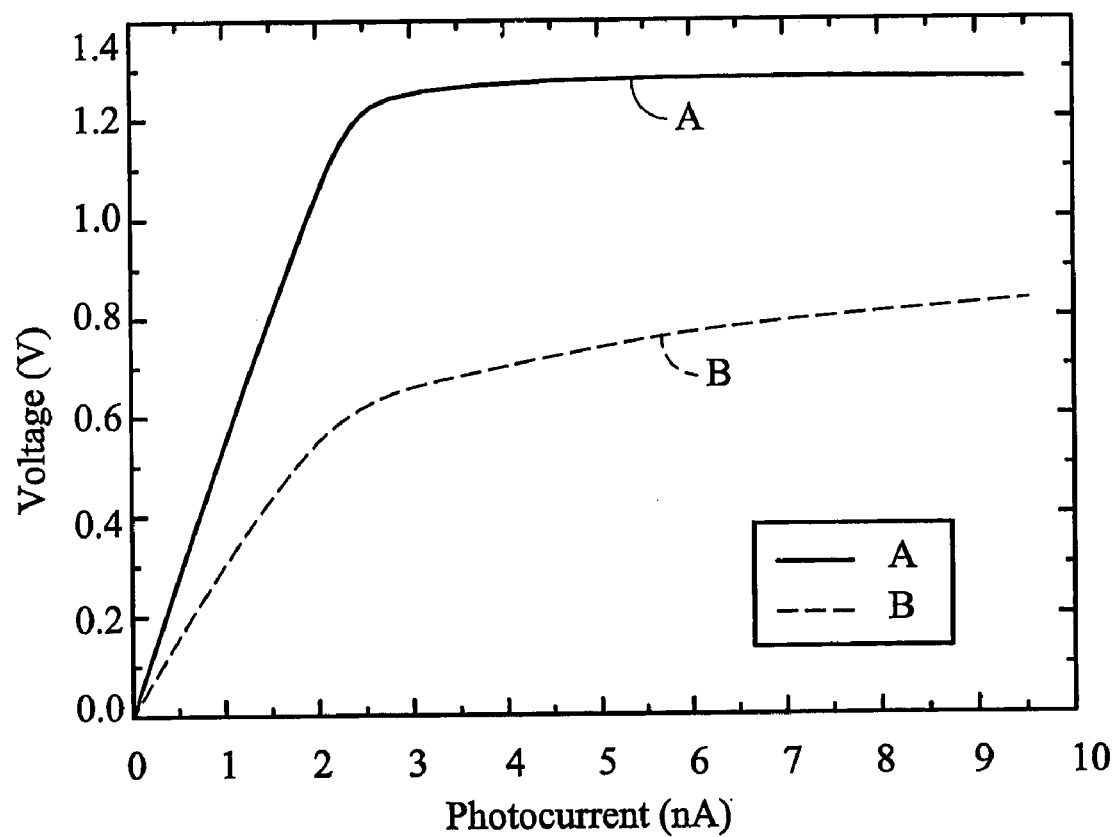
FIG. 3 shows relationships between output voltage and the photocurrent.

FIG. 3 shows relationships between output voltage and the photocurrent. The curve A denotes responses of a conventional image sensor, and curve B denotes the responses generated by this embodiment. As the photocurrent increases, curve B is smoother, thus, the output voltage cannot achieve saturation and distortion. Therefore, the ratio of maximum voltage and minimum voltage of the curve B is higher than the curve A for obtaining a better dynamic range.

Figure 4:
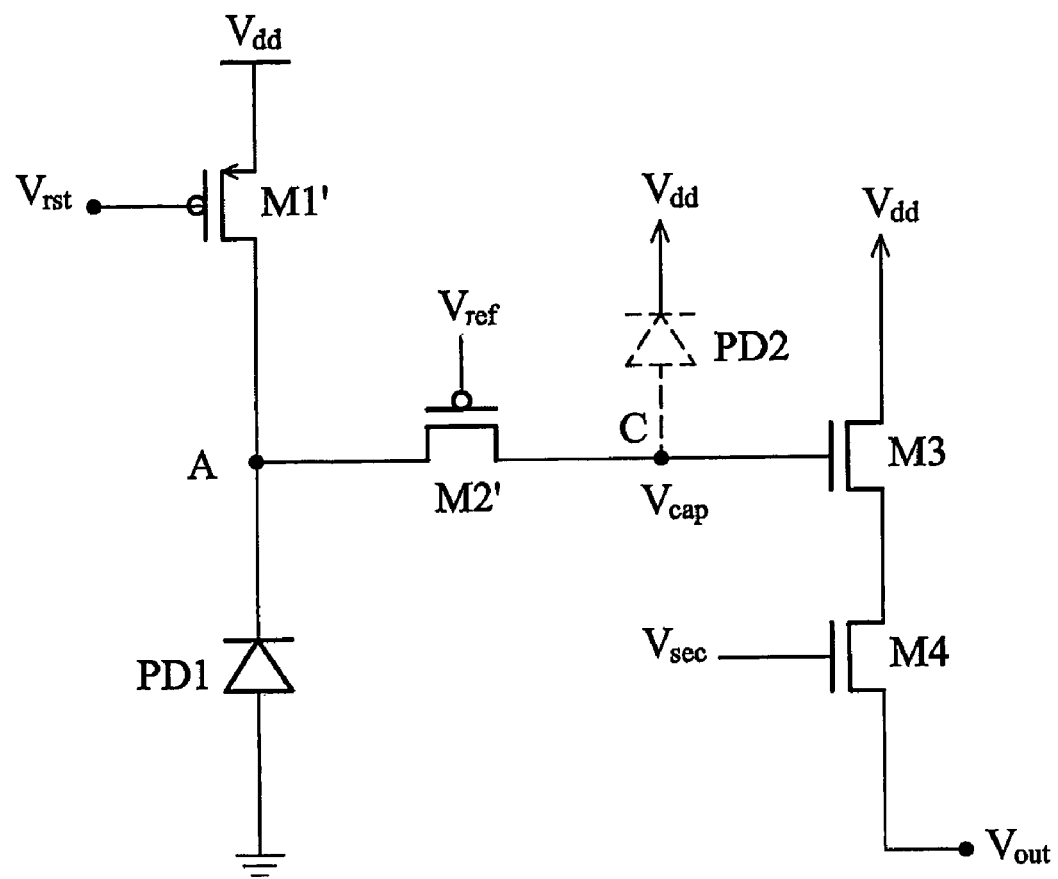
FIG. 4 shows another embodiment of the image sensor according to the invention.

FIG. 4 shows another embodiment of the image sensor. In comparison to the embodiment of FIG. 1, the NMOS transistor M1 and M2 are substituted by a PMOS M1' and M2'. The gate of transistor M2' is coupled to the reference voltage $V_{ref}$, and source/drain each coupled to node A and C. In addition, a diode PD2 is coupled to node C as a parasitic PN junction for the transistor M2'. The diode PD2 is reverse biased by the voltage $V_{dd}$. When light intensity is high, the diode PD2 can further provide fine tuning of the output curve.

Figure 5:
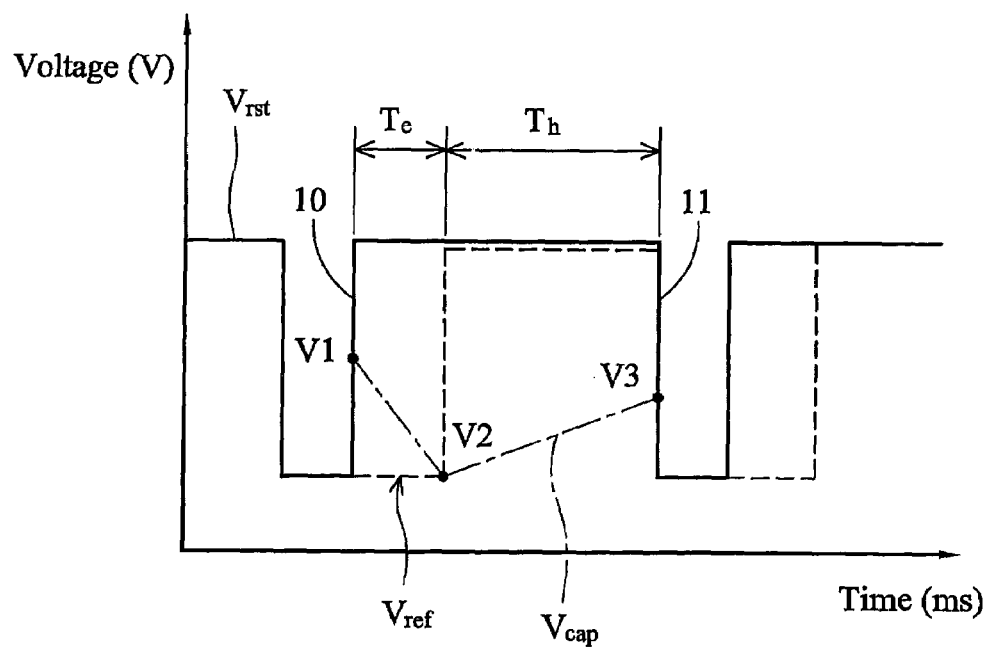
FIG. 5 is a timing chart of FIG. 4.

FIG. 5 is a timing chart of the image sensor in FIG. 4, showing the relationships between the reference voltage $V_{ref}$, the reset signal $V_{rst}$ and the voltage on node C, $V_{cap}$. The reference voltage $V_{ref}$ is a square wave signal. A duration Te exists between the rising edge of the reference voltage $V_{ref}$ and the rising edge 10 of the reset signal $V_{rst}$, and a duration Th exists between the rising edge of the reference voltage $V_{ref}$ and the falling edge 11 of the reset signal $V_{rst}$. Initially, in a reset stage, the reset signal $V_{rst}$ is at low potential, the voltage on node A is $V_{dd}$, and the reference voltage $V_{ref}$ is at low potential. The transistor M2' is activated, and the voltage on diode PD1 is $V_{cap}$. Thereafter, the process goes into a response stage, and the reset signal $V_{rst}$ is switched from low potential to high potential while the reference voltage $V_{ref}$ remains low. As a result, the transistor M1' is deactivated, and the transistor M2' remains activated. The voltage on node C is gradually decreased from V1 V2 as photocurrent flows. The process goes to a second response stage after the duration Te, the reference voltage $V_{ref}$ is switched to high potential, and the transistor M2' is deactivated. The luminance accumulates electrons and holes in the diode PD2, making the voltage $V_{cap}$ increase. The area of the diode PD1 is greater than that of the diode PD2, thus the difference of V1 and V2 (V1−V2) is much greater than the difference of V2 and V3(V2−V3) The value of V1 minus V2 may be saturated during the period Te, however, the value of V2 minus V3 increases during the period Th. Thus the saturation can be compensated significantly, and the dynamic range of the image sensor can be expanded.

Figure 6:
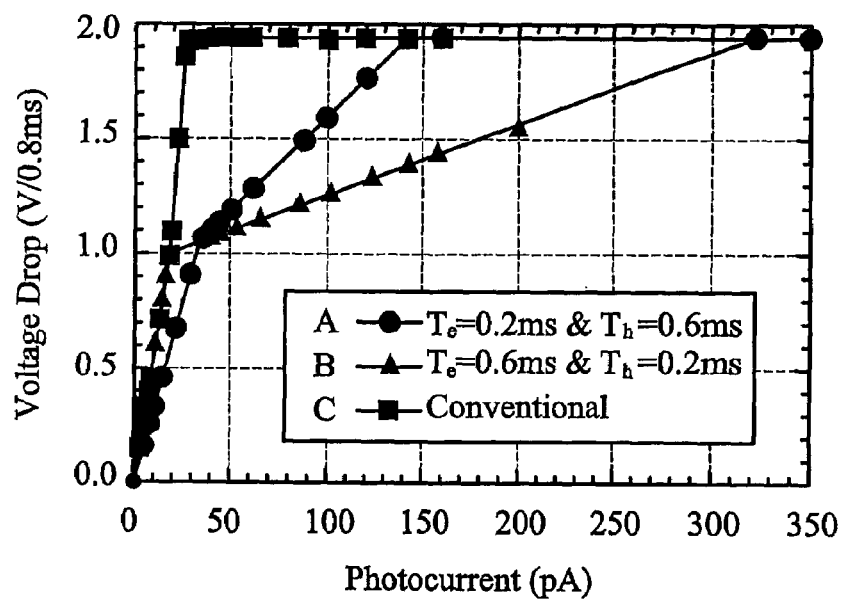
FIG. 6 shows relationships between voltage drops and the photocurrent.

FIG. 6 shows relationships between voltage drops and the photocurrent. The X axis is the photocurrent magnitude, and the Y axis is the output voltage drop of the image sensor. As shown in FIG. 6, a better dynamic range is obtained by this embodiment. The duration Te and Th are adjustable to change the linear scale of the light intensity and output voltage drop, thus, saturation caused due to the over exposed luminance can be effectively avoided.

Figure 7:
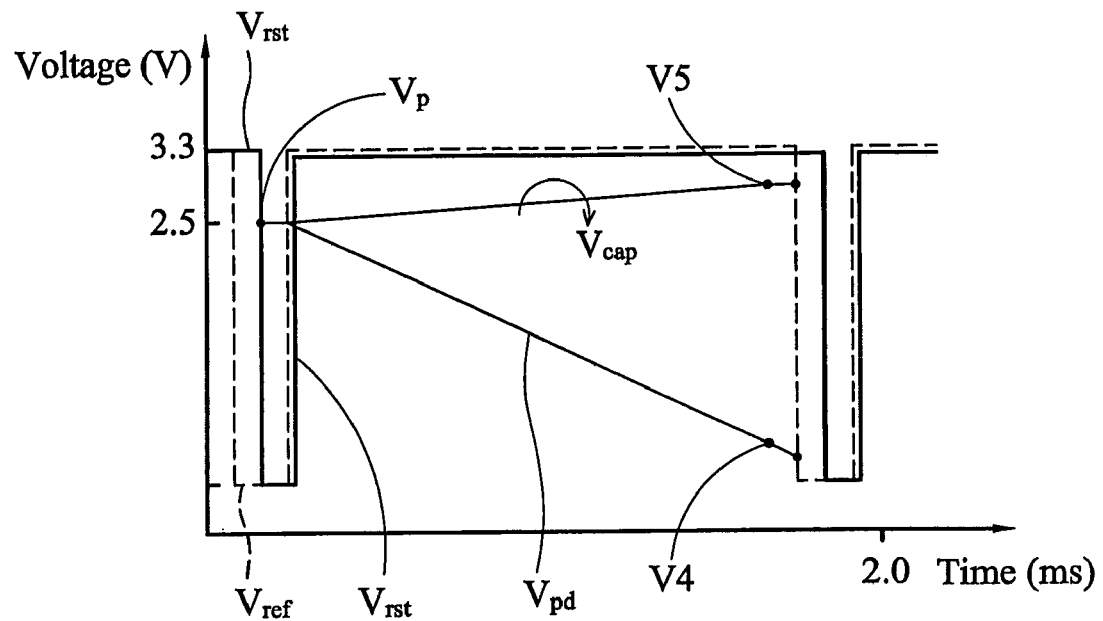
FIG. 7 shows another embodiment of the timing chart of FIG. 4.

FIG. 7 shows another embodiment of the timing chart of FIG. 4. Initially, the process is in a reset stage, wherein the reset signal $V_{rst}$ is at high potential, and the transistor M1' is deactivated. When the reset signal $V_{rst}$ switches to low potential, the transistor M1' is activated, and the voltage on the diode PD1, $V_{pd}$, as well as $V_{cap}$, are at a level lower than 3.3 V (point $V_p$ in FIG. 7). Thereafter, the process goes to a response stage, the reference voltage $V_{ref}$ and the reset signal $V_{rst}$ are pulled to high potential, and the transistors M1' and M2' are deactivated. The voltage $V_{cap}$ increases as the electronic holes accumulate, and conversely, the voltage $V_{pd}$ decreases as the electrons accumulate. When the reference voltage $V_{ref}$ switches from low to high, the voltage $V_{pd}$ reaches V4, and $V_{cap}$ reaches V5. The difference between the voltages V5 and V4 (V5−V4) is the eventual output of the image sensor, having better sensitivity and dynamic range.

Figure 8:
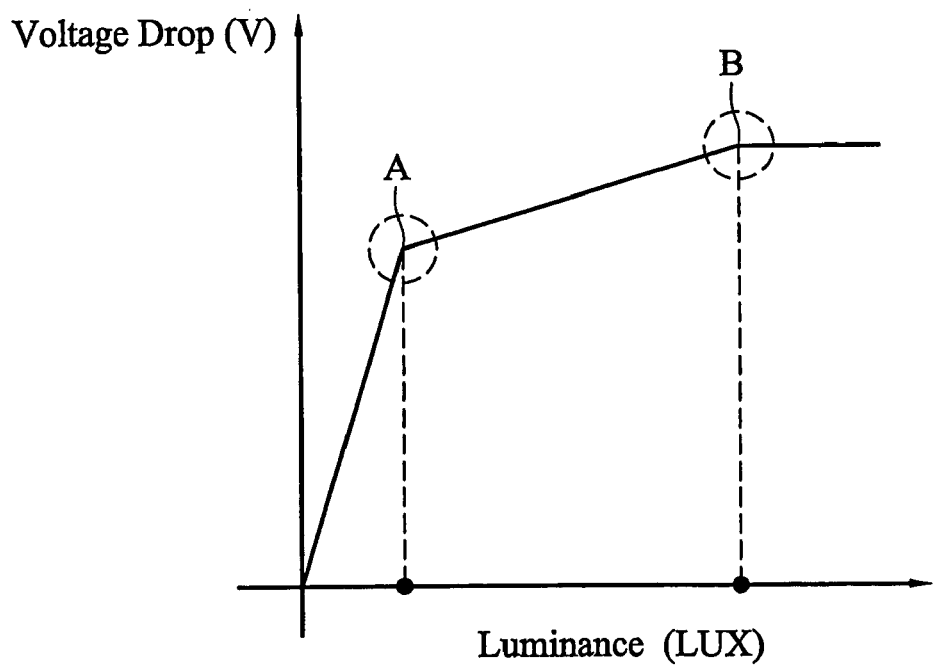
FIG. 8 shows relationships between voltage drop and the photocurrent according to FIG. 4.

FIG. 8 shows relationships between voltage drops and the photocurrent according to FIG. 4. When the luminance is weak, the voltage drop on node A can be determined by the sensitivity of the diode PD1. When the luminance is strong, the voltage drop on node B can be determined by the sensitivity of the diode PD2.

While the invention has been described by way of example and in terms of the preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An image sensor, comprising:
 a pixel sensor, receiving illumination to generate a photocurrent;
 a first transistor, coupled to a voltage source and the pixel sensor, controlled by a reset signal to activate or deactivate, wherein a first node is coupled to the first transistor and the pixel sensor, and the voltage source provides a first potential;
 a second transistor, coupled to a second node and the first node, receiving a reference voltage;
 a third transistor, coupled to the voltage source, controlled by the voltage on the second node; and
 a fourth transistor, coupled to the third transistor and an output node of the image sensor, controlled by a selection signal to activate or deactivate; and
 a diode, coupled to the second node as a parasitic PN junction for the second transistor, wherein the diode is reverse biased by the voltage source.

2. The image sensor as claimed in claim 1, wherein the first to fourth transistors are NMOS transistors.

3. The image sensor as claimed in claim 1, wherein:
 the first and second transistors are PMOS transistors;
 the third and fourth transistors are NMOS transistors;
 the gate of the second transistor receives the reference voltage; and
 the source and drain of the second transistor couple to the first and second node respectively.

4. An image sensing method for an image sensor comprising:

a pixel sensor, receiving illumination to generate a photocurrent;

a first transistor, coupled to a voltage source and the pixel sensor, controlled by a reset signal to activate or deactivate, wherein a first node is coupled to the first transistor and the pixel sensor, and the voltage source provides a first potential;

a second transistor, coupled to a second node and the first node, receiving a reference voltage;

a third transistor, coupled to the voltage source, controlled by a potential of the second node; and a fourth transistor, coupled to the third transistor and the pixel sensor, controlled by a selection signal to activate or deactivate;

the image sensing method comprises: in a reset stage:

activating the first transistor through the reset signal, such that the first node is pulled to the first potential;

sustaining the reference voltage at a second potential, wherein the second potential is lower than the first potential;

in a response stage;

deactivating the first transistor through the reset signal, such that the potential of the first node is varied based upon an illumination received by the pixel sensor;

increasing the reference voltage gradually; and recording potential variations on the second node to generate an output proportional to the illumination received by the pixel sensor.

5. An image sensing method for an image sensor comprising:

a pixel sensor, receiving illumination to generate a photocurrent;

a first transistor, coupled to a voltage source and the pixel sensor, controlled by a reset signal to activate or deactivate, wherein a first node is coupled to the first transistor and the pixel sensor, and the voltage source provides a first potential;

a second transistor, coupled to a second node and the first node, receiving a reference voltage;

a third transistor, coupled to the voltage source, controlled by a potential of the second node; and a fourth transistor, coupled to the third transistor and the pixel sensor, controlled by a selection signal to activate or deactivate; wherein:

the gate of the second transistor receives the reference voltage; and the source and drain of the second transistor couple to the first and second node respectively;

the image sensing method comprises:

in a reset stage:

activating the first transistor through the reset signal, such that the first node is pulled to the first potential;

sustaining the reference voltage at a second potential, wherein the second potential is lower than the first potential;

in a first response stage;

deactivating the first transistor through the reset signal, such that the potential of the second node varies with an illumination received by the pixel sensor;

increasing the reference voltage gradually; and recording the potential variation on the second node to generate an output proportional to the illumination received by the pixel sensor.

6. The image sensing method as claimed in claim 5, further comprising in a second response stage, deactivating the second transistor through the reference voltage.

7. The image sensing method as claimed in claim 5, further comprising recording a voltage difference between the first node and the second node when the first response stage is finished.

* * * * *